(12) United States Patent
Higuchi et al.

(10) Patent No.: US 7,897,065 B2
(45) Date of Patent: Mar. 1, 2011

(54) POLYCRYSTALLINE ALUMINUM THIN FILM AND OPTICAL RECORDING MEDIUM

(75) Inventors: Takanobu Higuchi, Tsurugashima (JP); Yasuo Hosoda, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 12/818,562

(22) Filed: Jun. 18, 2010

(65) Prior Publication Data

US 2010/0310895 A1  Dec. 9, 2010

Related U.S. Application Data

(62) Division of application No. 12/158,867, filed as application No. PCT/JP2006/324952 on Dec. 14, 2006, now Pat. No. 7,790,064.

(30) Foreign Application Priority Data

Dec. 22, 2005  (JP)  ............................. 2005-369499

(51) Int. Cl.
  *H01B 1/02*   (2006.01)
  *C23C 14/14*  (2006.01)
  *C23C 14/34*  (2006.01)
  *G11B 7/258*  (2006.01)
  *H01L 51/50*  (2006.01)
  *H05B 33/26*  (2006.01)

(52) U.S. Cl. ............... 252/512; 369/272.1; 204/192.15; 428/457; 420/530

(58) Field of Classification Search ................. 252/512, 252/514; 420/530; 369/272.1; 428/409, 428/457; 204/192.15
See application file for complete search history.

(56) References Cited

U.S. PATENT DOCUMENTS

| 4,040,822 A  * | 8/1977 | Stern ......................... 420/530 |
| 6,517,954 B1 * | 2/2003 | Mergen et al. ............... 428/653 |
| 2002/0054564 A1 | 5/2002 | Koizumi et al. |

FOREIGN PATENT DOCUMENTS

| JP | 06-163706 A | 6/1994 |
| JP | 08-100255 A | 4/1996 |
| JP | 2880190 B2 | 4/1999 |
| JP | 2898112 B2 | 5/1999 |
| JP | 2002-050091 A | 2/2002 |
| JP | 2003-030901 A | 1/2003 |
| JP | 3365762 B2 | 1/2003 |
| JP | 3655907 B2 | 6/2005 |

* cited by examiner

*Primary Examiner*—Mark Kopec
(74) *Attorney, Agent, or Firm*—Sughrue Mion, PLLC

(57) ABSTRACT

A polycrystalline aluminum thin film is made of polycrystals of an alloy of aluminum. The polycrystalline aluminum thin film includes a first additive which is distributed with even concentration over an inside of each crystal grain and an interface of the crystal grain and a second additive which is distributed with higher concentration in the interface of the crystal grain than in the inside of the crystal grain.

7 Claims, 3 Drawing Sheets

POLYCRYSTALLINE ALUMINUM THIN FILM AND OPTICAL RECORDING MEDIUM

CROSS-REFERENCE TO RELATED APPLICATIONS

This is a Divisional of U.S. patent application Ser. No. 12/158,867 (now U.S. Pat. No. 7,790,0964) filed Oct. 23, 2008, which is a National Stage Application filed under §371 of PCT Application No. PCT/JP2006/324952 filed Dec. 14, 2006, which claims priority based on JP 2005-369499, filed on Dec. 22, 2005. The entire disclosures of the prior applications are considered part of the disclosure of the accompanying divisional application, and are hereby incorporated by reference.

TECHNICAL FIELD

The present invention relates to a polycrystalline aluminum thin film and further relates to the application of the polycrystalline aluminum thin film to an optical recording medium, a magnetic disc, an optical memory, a mirror, an electrode, and the like.

BACKGROUND ART

An optical recording medium such as a Blu-ray-R disc contains a reflective film inside irrespective of its recording and reproduction methods. This reflective film is generally made of aluminum, gold, silver, alloys thereof, or silicon. Taking a case of, for example, an optical disc such as a CD or a DVD, a thin film made of an alloy of aluminum or gold is used. A pure gold thin film or a pure silicon thin film is used in a semi-transparent film of the DVD. (Refer to Japanese Patent No. 2880190, Japanese Patent No. 2898112, Japanese Patent No. 3365762, and Japanese Patent No. 3655907)

In an optical recording device which uses a blue laser with a wavelength of approximately 400 nm for recording or reproducing information, a gold or silicon thin film does not have sufficient reflectivity as a reflective film of a recording medium thereof because an absorption coefficient for blue light is high. An alloy of silver has sufficient reflectivity, but brings increase in cost.

The optical recording medium such as the CD, the DVD, and the Blu-ray disc is becoming denser and having high capacity, and hence the sophistication of the reflective film of the optical recording medium is required.

DISCLOSURE OF THE INVENTION

Problems to be Solved by the Invention

Aluminum and an alloy of aluminum are superior to the alloy of silver in terms of cost and ease of handling. It was very difficult, on the other hand, to sufficiently reduce the diameter of a crystal grain of these aluminum family reflective films with respect to the laser spot size of the optical recording device by the blue laser on the reflective film of, in particular, the Blu-ray disc. Thus, a disc using the aluminum family reflective film had high noise in recording and reproduction, and could not obtain sufficient recording and reproduction characteristics.

As the application of aluminum, alloys of aluminum adding Cu, Ta, or Mg have been used and studied as an electrode. Using the alloys, however, necessarily increased wiring resistance, and the compatibility between reduction in resistance and the restraint of hillock and migration was difficult.

An object of the present invention is to provide a polycrystalline aluminum thin film made of aluminum or an alloy of aluminum which is superior in terms of cost and ease of handling and a recording medium or the like which uses the polycrystalline aluminum thin film and has preferable recording and reproduction characteristics in an optical recording and reproduction device using a short-wavelength laser.

Resolving Means/Means for Resolving the Problems

A polycrystalline aluminum thin film according to the present invention is made of polycrystals of an alloy of aluminum. The polycrystalline aluminum thin film contains a first additive which is distributed with even concentration over the inside of each crystal grain and the interface of the crystal grain and a second additive which is distributed with higher concentration in the interface of the crystal grain than in the inside of the crystal grain.

EXPLANATION OF REFERENCE NUMERALS

Figure 1:
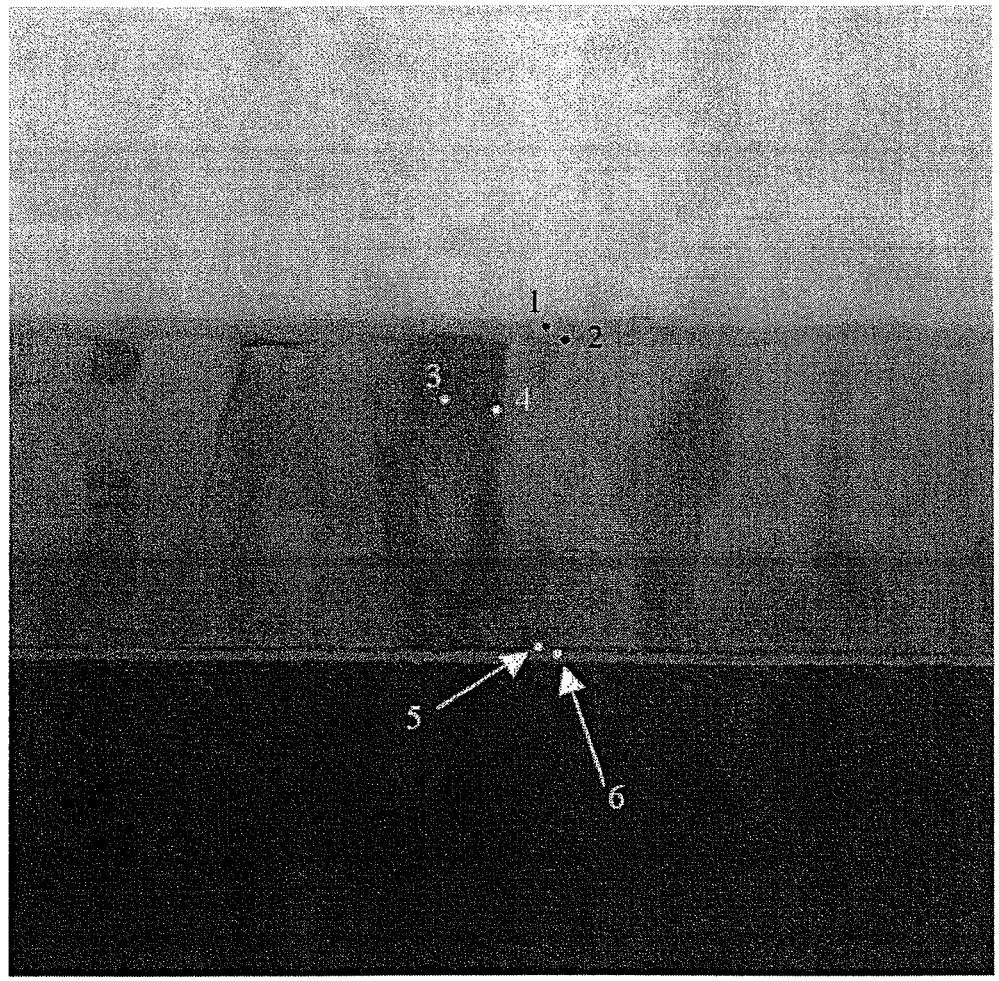
FIG. 1 is an image of Al—Pd—$SnO_2$ thin film by a transmission electron microscope in a cross-sectional scan.

1 . . . optical disc
11 . . . substrate
12 . . . reflective film
13 . . . second protective layer
14 . . . recording film
15 . . . first protective layer
16 . . . resin cover layer

DETAILED DESCRIPTION OF THE INVENTION

The occurrence of hillock and migration which was assumed in the development of a polycrystalline aluminum thin film made of an alloy of aluminum was considered. As a result, stress occurs inside the polycrystalline aluminum thin film due to the movement of a carrier and the hysteresis of heat. It is assumed that the stress works as driving force to cause the diffusion of Al atoms along a grain boundary, and hence the hillock or the like is formed.

The inventor found that introducing an oxide in forming an alloy made it possible to restrain the occurrence of the hillock or the like in the diffusion of the Al atoms along the grain boundary. The alloying could not help increasing the resistance of a wiring film. By adding a platinum group element to Al, however, it became possible to obtain a polycrystalline aluminum thin film as a reflective film and a material for an electrode which had the function of light reflection or heat dissipation and the possibility of hillock prevention.

In the thin film deposited by sputtering, approximately even super-saturated solid solution is generally formed. It is conceivable that the super-saturated solid solution is formed in the thin film made of aluminum with the platinum group element. In such super-saturated solid solution, the platinum group element discharged into the grain boundary in the process of depositing a film inhibits the diffusion of Al in the grain boundary and evenly alleviates the compression stress of the film made of Al-platinum group element. After a series of thermal hysteresis such as a film deposition process and the like, the super-saturated solid platinum group element has been almost completely deposited on the grain boundary as an intermetallic compound, so that it is possible to prevent increase in resistance to a certain extent.

Thus, the inventor proposes a polycrystalline aluminum thin film which comprises a plurality of crystal grains having aluminum as the main ingredient and an interface section with high concentration for covering the crystal grain having aluminum as the main ingredient. Such a polycrystalline aluminum thin film satisfies any of the following characteristics and conditions described in (1) to (4).

(1) A polycrystalline thin film made of an alloy of aluminum comprises a first additive (single element or compound thereof) which exists inside a crystal grain having aluminum as the main ingredient and is distributed with even concentration in the thin film and a second additive (single element) which is distributed with higher concentration in the interface of the crystal grain having aluminum as the main ingredient than in the inside of the crystal grain.

(2) At least one of Sn, Ti, Nb, and oxides thereof is used as the first additive which exists inside the crystal grain and is distributed with even concentration in the thin film. In the case where the oxide is used, a conductive or semiconducting oxide is available in addition to the oxides of Sn, Ti, and Nb.

(3) An element which has a higher melting point than aluminum and is resistant to oxidizing (an element with lower ionicity than aluminum, and more preferably an element stable against water, vapor, and acid with low oxidizing power) is used as the second additive which is distributed with high concentration in the interface of the crystal grain.

(4) an aluminum oxide layer exists in the surface of the polycrystalline thin film. The foregoing additives do not exist or exist in minute quantities in the aluminum oxide layer, and the foregoing additives are unevenly distributed in the interface between the aluminum oxide layer and a layer with not-oxidized aluminum as the main ingredient.

Example

Two kinds of polycrystalline aluminum thin films made of Al—Pd—$SnO_2$ and Al—Ti were formed on silicon substrates by sputtering for comparison. Sputtering power was 300 W, and the thicknesses of the polycrystalline aluminum thin films measured by a fluorescent X-ray analyzer (ZXS-100S manufactured by Rigaku Electric Industry Co., Ltd) were 93 nm and 78 nm, respectively. To analyze the distribution of elements inside these polycrystalline aluminum thin films, the polycrystalline aluminum thin films were cut by concurrently using ion milling (600 series manufactured by Gatan, Inc), and cross sections were observed using a field emission type electron microscope with an energy dispersive X-ray analyzer (JEM-2100F manufactured by JEOL Ltd.). The abundance ratios of each element in the cross sections of the thin films were measured by an energy dispersive X-ray spectroscopy, EDX.

FIG. 1 shows an image of the Al—Pd—$SnO_2$ thin film by a scanning transmission electron microscope (STEM).

Table 1 shows the abundance ratio (standardized by atomicity) among Al, Pd, and Sn in positions indicated with numbers in FIG. 1. Argon (Ar) serving as a sputtering gas, carbon (C) which is likely to be derived from pollution in the process of manufacturing electron microscope samples, and oxygen (O) derived from oxidation were detected in addition to Al, Pd, and Sn, but these were left out of the calculation of the abundance ratio.

TABLE 1

| | Abundance ratio (atomic ratio) | | |
|---|---|---|---|
| Analysis point | Al | Pd | Sn |
| 1 | 100.0 | 0.0 | 0.0 |
| 2 | 95.3 | 3.0 | 1.7 |
| 3 | 99.5 | 0.3 | 0.2 |
| 4 | 98.5 | 1.5 | 0.0 |
| 5 | 94.4 | 3.9 | 1.7 |
| 6 | 97.2 | 1.5 | 1.2 |

Figure 2:
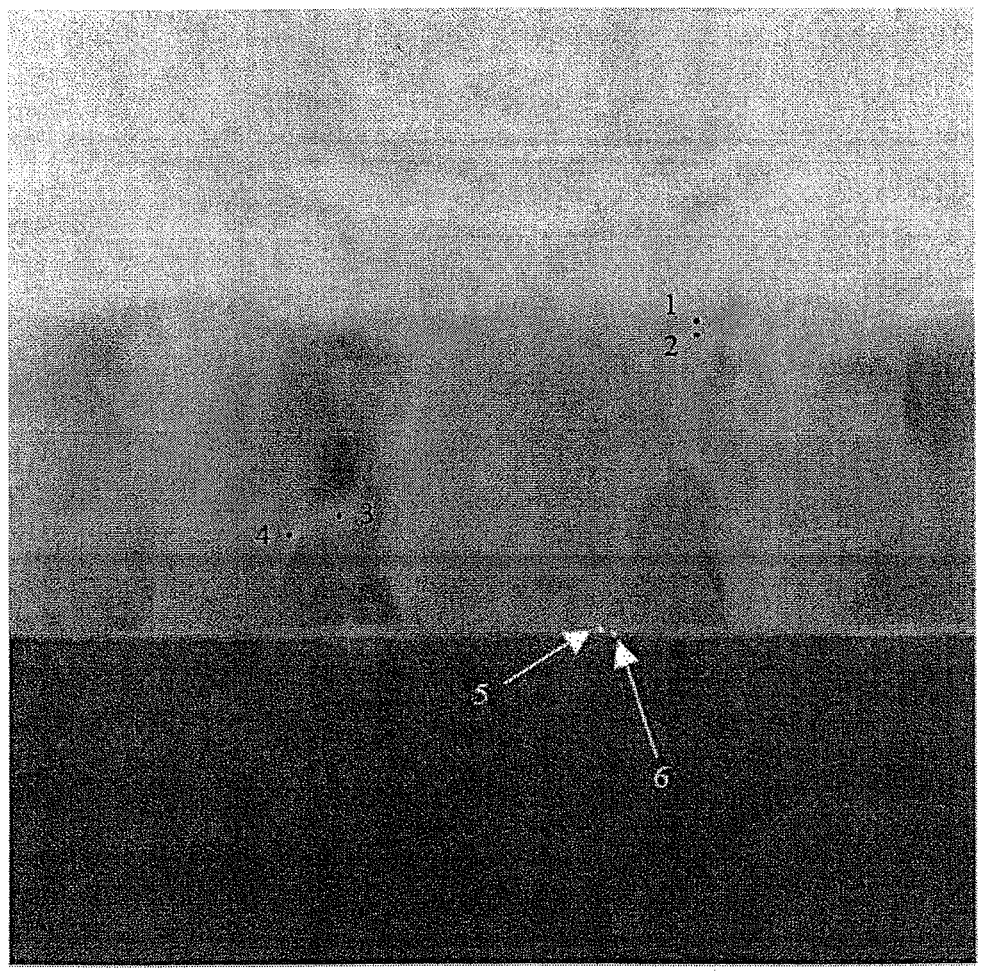
FIG. 2 is an image of Al—Ti thin film by the transmission electron microscope in the cross-sectional scan.

FIG. 2 shows an image of the Al—Ti thin film by the scanning transmission electron microscope (STEM).

Table 2 shows the abundance ratio (standardized by atomicity) between Al and Ti in positions indicated with numbers in FIG. 2. Argon (Ar) serving as the sputtering gas, carbon (C) which is likely to be derived from pollution in the process of manufacturing electron microscope samples, and oxygen (O) derived from oxidation were detected in addition to Al and Ti, but these were left out of the calculation of the abundance ratio.

TABLE 2

| | Abundance ratio (atomic ratio) | |
|---|---|---|
| Analysis point | Al | Ti |
| 1 | 100.0 | 0.0 |
| 2 | 98.8 | 1.2 |
| 3 | 99.2 | 0.8 |
| 4 | 99.1 | 0.9 |
| 5 | 98.6 | 1.4 |
| 6 | 99.2 | 0.8 |

As is apparent from the foregoing analysis results, in the polycrystalline aluminum thin film made of Al—Pd—$SnO_2$, the abundance ratio of Pd is higher in a crystal grain boundary (a position of number 4 of FIG. 1) than inside a crystal grain (a position of number 3 of FIG. 1), and the abundance ratio of $SnO_2$ is almost the same. In the polycrystalline aluminum thin film made of Al—Ti, on the other hand, the abundance ratio of Ti does not have significant difference in comparing between the inside of a crystal grain (a position of number 3 of FIG. 2) and a crystal grain boundary (a position of number 4 of FIG. 2). It is also apparent that additive elements such as Pd, Sn, and Ti gather in spaces between an aluminum oxide layer in the surface of the thin film and a not-oxidized layer (interface layer, positions of numbers 2 and 5 in both of FIGS. 1 and 2).

When an oxide of a metal except for aluminum and an element (second additive element) which has a higher melting point than aluminum and is resistant to oxidizing are introduced into sputtering atmosphere together with aluminum or an alloy of aluminum and sputtering is carried out, the oxide and the second additive elements are scattered with discharge and taken into the film. Such an oxide taken into a crystal grain of aluminum or the alloy of aluminum composing the polycrystalline aluminum thin film causes the distortion of a crystal lattice and hence inhibits the growth of the aluminum crystal grain. Such a second additive element is deposited on the crystal interface of the aluminum crystal grain, and inhibits the growth of the aluminum crystal grain by preventing a wall of the aluminum crystal grain from being extended. Thus, the oxide and the second additive element inhibit the growth of the aluminum crystal grain in the process of depositing the film. As described above, it is possible to keep the crystal grain very small. Typically, the average diameter of the crystal grain of the polycrystalline aluminum thin film including the additive elements was smaller than 47 nm. Making the crystal grain minute can expect the effects of restraining hillock and migration.

As described above, this embodiment provides the aluminum thin film including two kinds of additives, that is, the first additive (single element or compound, for example, Ti, $SiO_2$, or the like) which exists inside the crystal having aluminum as the main ingredient and is distributed in the thin film with even concentration and the second additive (single element, for example, Pd, Pt, Au, Ag, Ru, Rh, or the like) which is distributed with higher concentration in the interface of the crystal grain than inside the crystal having aluminum as the main ingredient.

As the second additive which is distributed with higher concentration in the interface of the crystal grain, an element which has the higher melting point than aluminum and is resistant to oxidizing such as Pd, Pt, Au, Ag, Ru, Rh, or the like is selected.

An aluminum oxide layer exists in the surface of the thin film, and the additives do not exist or exist in minute quantities in the aluminum oxide layer. The foregoing additives are unevenly distributed in the interface between the aluminum oxide layer and a layer with not-oxidized aluminum as the main ingredient.

Furthermore, when measuring reflectivity with respect to the relationship between the amount of the second additive and the reflectivity in the polycrystalline aluminum thin film, the addition of the second additive causes reduction in the reflectivity. It was confirmed that the amount of adding Pd to the polycrystalline aluminum thin film was 8 atoms % in the case of allowing a 10% reduction in the reflectivity, more preferably 6 atoms % in the case of allowing an 8% reduction in the reflectivity, furthermore preferably 3 atoms % in the case of allowing a 6% reduction in the reflectivity, and most preferably 0.6 atoms % at which noise reduction came to maximum. Thus, it is preferable to contain Pd at 0.6 to 8 atoms % in the polycrystalline aluminum thin film on the whole.

In a like manner, the amount of adding Au is 7 atoms in the case of allowing a 10% reduction in the reflectivity, more preferably 5 atoms in the case of allowing an 8% reduction in the reflectivity, and furthermore preferably 3 atoms in the case of allowing a 6% reduction in the reflectivity. Furthermore, 1.5 atoms % at which noise reduction comes to maximum is the most preferable. Thus, it is preferable to contain Au at 1.5 to 7 atoms % in the polycrystalline aluminum thin film on the whole.

In a like manner, the amount of adding Pt is 5 atoms % in the case of allowing a 10% reduction in the reflectivity. Furthermore, 0.4 atoms at which noise reduction comes to maximum is the most preferable. Thus, it is preferable to contain Pt at 0.4 to 5 atoms % in the polycrystalline aluminum thin film on the whole.

Practical Example 1

A write-once-read-many optical disc (hereinafter referred to as a WORM disc) will be described as one example though the optical recording medium according to the present invention is not limited thereto.

A WORM disc provided with an Al—Pd—$SnO_2$ reflective film was formed. As comparative samples, WORM discs provided with a pure Al reflective film, an Al—Pd reflective film, and an Al—$SnO_2$ reflective film, respectively, were formed.

Figure 3:
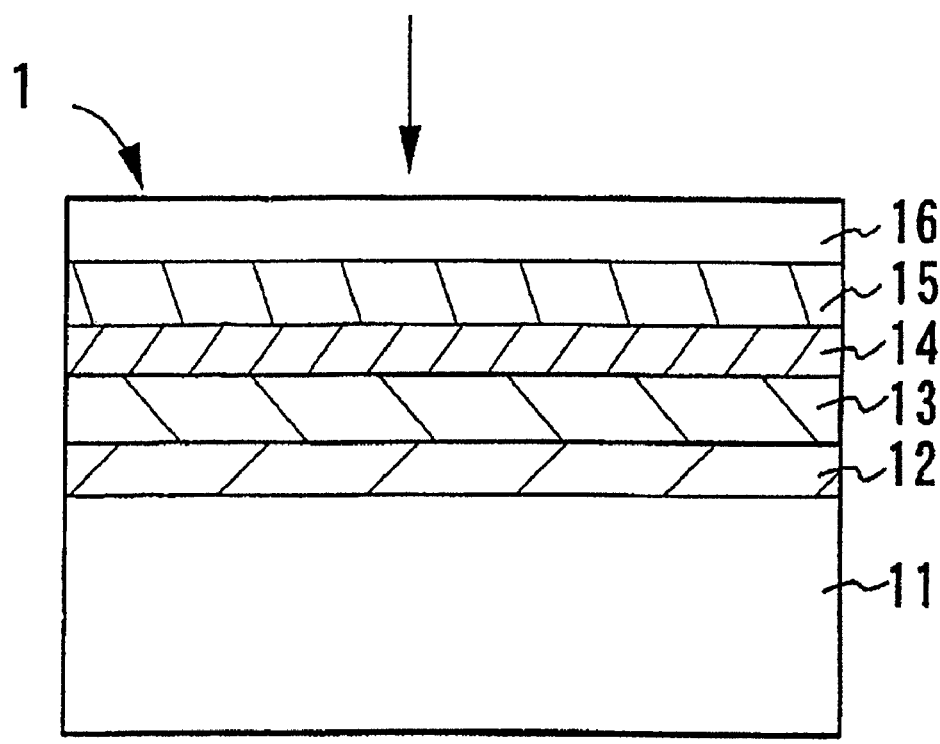
FIG. 3 is a sectional view of an optical disc.

Referring to FIG. 3, each of the WORM discs has multi-layer structure in which a reflective film 12, a second protective layer 13, a recording film 14, and a first protective layer 15 are laminated in this order on a disc-shaped substrate 11 by sputtering and then a resin cover layer 16 is put on. The substrate 11 made of a polycarbonate resin has the shape of a disc with a thickness of 1.1 mm and a diameter of 12 cm, and has a spiral groove with a pitch of 0.320 μm. On this substrate 11, the reflective film 12 made of Al, Al—Pd, Al—$SnO_2$ or Al—Pd—$SnO_2$, the second protective layer 13 made of ZnS—$SiO_2$, the recording film 14 made of Bi—Ge—N, and the first protective layer 15 made of ZnS—$SiO_2$ were laminated in this order by sputtering. Sputtering power was 700 W or 2000 W depending on a sputtering device and the like. Table 3 shows the layers of the disc, the materials of the layers, and the thicknesses of the layers. Furthermore, a polycarbonate sheet was pasted thereon using a UV curable resin as an adhesive to make a light incident side substrate (cover layer) 16 with a thickness of 0.1 mm. It should be appreciated that light for recording or reproducing information is applied on the recording film 14 from the side of the resin cover layer 16.

TABLE 3

| Layer | Material | Thickness |
|---|---|---|
| Reflective film | Al | 50 nm |
|  | Al—Pd |  |
|  | Al—$SnO_2$ |  |
|  | Al—Pd—$SnO_2$ |  |
| Second protective film | ZnS—$SiO_2$ | 20 nm |
| Recording film | Bi—Ge—N | 12 nm |
| First protective film | ZnS—$SiO_2$ | 25 nm |

In such four kinds of discs, a random pattern with 1 to 7 modulations was recorded on a guide groove surface being in a convex shape with respect to the side of light incident at a linear velocity of 4.92 m/s with the use of an optical head with a wavelength of 405 nm and a numerical aperture of an objective lens of 0.85. Multi-pulse was used in this recording, and the width of a window was 15.15 nsec. Table 4 shows total noise, recording LD power, and jitter after recording measured in the four kinds of discs.

TABLE 4

| Material (composition atomic ratio) | Total noise | Recording power | Jitter after recording | Sputtering power |
|---|---|---|---|---|
| Al (100%) | −42.0 dB | 5 mW | 7.5% | 2000 W |
| Al—Pd (95.9:4.1) | −45.1 dB | 5 mW | 6.9% | 700 W |
| Al—$SnO_2$ (99.87:0.13) | −41.9 dB | 6 mW | 7.9% | 700 W |
|  | −42.6 dB | 5 mW | 6.5% | 2000 W |
| Al—$SnO_2$—Pd (96.32:0.13:3.55) | −45.6 dB | 5 mW | 6.9% | 700 W |

As a way to restrain noise during recording and reproduction with a practically usable level and improve recording and reproduction characteristics, it is preferable that the average diameter of a crystal grain of the reflective film 12 be smaller than a laser spot size (diameter) d. To further improve the recording and reproduction characteristics, it is preferable that the average diameter of the crystal grain be smaller than a half of the laser spot size d. More preferably, the average diameter of the crystal grain is smaller than one-fifth of the laser spot size d, and most preferably is smaller than one-tenth of the laser spot size d. If such a reflective film is used in a recording medium for optical recording and reproduction by a short wavelength laser such as a blue laser, it is possible to obtain a stable and preferable recording characteristic.

To be more specific, a laser spot size (diameter) d in an optical recording device with a laser is expressed by d=l/NA with the use of a laser wavelength l and a numerical aperture NA. Taking a case of, for example, l=400 nm and NA=0.85, d is 470 nm. The average diameter of a crystal grain of the reflective film 12 made of pure aluminum or an alloy of aluminum containing an oxide of metal except for aluminum according to this invention is smaller than 47 nm being one-tenth of a value of d described above.

The present invention does not limit the type or the number of the protective layers 13 and 15. The protective layers 13 and 15 may be made of, for example, a metal compound such as a metal nitride, a metal oxide, a metal carbide, and a metal sulfide or a mixture thereof, including ZnS and $SiO_2$.

In a like manner, the material of the recording film 14 is appropriately changeable. When the material of the recording film 14 is, for example, a phase change material such as SbTe, GeSbTe, GeSbBiTe, GeBiTe, and InAgSbTe, such a recording disc becomes a rewritable recording disc. When the recording film 14 is made of a dye film such as an azo dye, a cyanine dye, and a phthalocyanine dye, the recording disc becomes an organic dye type recording disc. In other words, the present invention is widely available in recording mediums using an optical reflective film. The present invention is available in, for example, a card type optical recording or optical magnetic recording medium which does not have a disc shape. The present invention is also applicable to a radiating layer in a thermally assisted magnetic recording medium.

Co-sputtering by which a sputtering target is divided into a plurality of areas based on materials like an alloy of aluminum and an oxide of metal except for aluminum, or aluminum, a metal element (or metal compound), and an oxide of metal except for aluminum may be used. In other words, an oxide of metal except for aluminum is introduced into sputtering atmosphere together with aluminum or an alloy of aluminum. Thus, the reflective film 12 is made of pure aluminum or the alloy of aluminum into which the oxide of metal except for aluminum is taken. Accordingly, it is possible to keep its crystal grain small without reducing reflectivity. When the oxide of metal except for aluminum is introduced into the sputtering atmosphere together with aluminum or the alloy of aluminum and sputtering is carried out, the oxide is scattered with discharge and is taken into the film. Such an oxide inhibits the growth of the crystal grain of aluminum or an alloy of aluminum composing the reflective film 12 during a deposition process, and hence it is possible to keep the crystal grain very small. It is generally conceivable that adding an oxide to a reflective film is undesired because reflectivity is reduced. The reflective film according to the present invention, however, can have preferable reflectivity and recording and reproduction characteristics even if the oxide is added. This is because that the average diameter of the crystal grain of the alloy of aluminum becomes minute greatly contributes as opposed to reduction in the reflectivity by adding the oxide.

Practical Example 2

A read-only disc will be described as one example though the optical recording medium according to the present invention is not limited thereto.

The read-only disc provided with an Al—Pd—$SnO_2$ reflective film and a read-only disc provided with an Al—Ti reflective film as a comparative example were formed.

Since the read-only disc is not recordable, the read-only disc has the same structure as the foregoing practical example 1 except that the second protective layer 13, the recording film 14 made of Bi—Ge—N, and the first protective layer 15 made of ZnS—$SiO_2$ are not formed. A substrate 11 made of a polycarbonate resin has the shape of a disc with a thickness of 1.1 mm and a diameter of 12 cm, and has a spiral pit row with a pitch of 0.320 μm. Recorded information is held in the pit row, and a random pattern with 1 to 7 modulations is recorded so that a minimum pit length becomes 0.149 μm. At this time, this disc has a storage capacity of 25 Gbytes. On this substrate 11, the reflective film 12 made of Al—Pd—$SnO_2$ or Al—Ti as the comparative example was formed by sputtering. Sputtering power was 300 W, and the thickness of the reflective film 12 was 15 nm. A polycarbonate sheet was pasted on the reflective film 12 using a UV curable resin as an adhesive to make a light incident side substrate (cover layer) 16 with a thickness of 0.1 mm. On the foregoing two kinds of discs, jitter was measured with the use of an optical head having a wavelength of 405 nm and a numerical aperture of an objective lens of 0.85. Linear velocity was 4.92 m/s and reproduction LD power was 0.35 mW. Table 5 shows measurement results.

TABLE 5

|  | Composition (atomic ratio) | Reproduction jitter |
|---|---|---|
| Disc with Al—Ti reflection film | Al:Ti = 99.2:0.8 | 5.5% |
| Disc with Al—Pd—$SnO_2$ reflection film | Al:Pd:$SnO_2$ = 98.3:1.5:0.2 | 5.2% |

It was considered that the quality of a signal depended on the shape of the pit raw formed in the substrate made of the polycarbonate resin or the like because the recorded information was held in the pits. However, since a low noise material is used in the reflective film, as this embodiment, the SN ratio (signal to noise ratio) of a reproduction signal is improved, and it becomes possible to obtain more preferable reproduction jitter. When the reflective film 12 is made thick to obtain high reflectivity, the reflective film 12 deforms the shape of pits in the resin substrate. Therefore, it is expected that structure according to the present invention, in which the diameter of crystal grain is small and even, can bring more superior performance.

Accordingly, the polycrystalline aluminum thin film according to the present invention can be used as a reflective film for use in the application of an optical recording medium, a magnetic disc, an optical memory, and the like. The polycrystalline aluminum thin film is available as various kinds of reflective mirrors, as a matter of course.

Furthermore, the polycrystalline aluminum thin film according to the present invention is available as an electrode. As an example, there is an organic electroluminescence (hereinafter simply called EL too) device. A plurality of organic EL devices is formed on a display panel substrate in a predetermined pattern. Each of the organic EL devices is provided with an organic material layer including a luminescent layer. The luminescent layer is composed of at least one thin film made of an electroluminescent organic compound material which emits light in response to an applied electric current.

The organic EL device comprises a transparent electrode, an organic EL medium, and a metal electrode which are laminated in this order on a transparent substrate. The organic EL medium may be, for example, a single layer of an organic electroluminescent layer, a medium with three layers of an organic positive hole carrying layer, an organic electroluminescent layer, and an organic electron carrying layer, a medium with two layers of an organic positive hole carrying layer and an organic electroluminescent layer, or a medium with laminated layers in which an electron or positive hole injection layer is appropriately inserted between the layers described above. The polycrystalline aluminum thin film according to the present invention is effectively usable as such a metal electrode.

When an auxiliary metal line with low resistance is used as an auxiliary electrode for wiring the transparent electrodes (anode) in a display panel in which a plurality of organic EL devices is arranged into a matrix to make resistance low, the polycrystalline aluminum thin film is effectively usable as a wiring material for protecting the metal line.

The invention claimed is:

1. A polycrystalline aluminum thin film made of polycrystals of an alloy of aluminum, comprising:
   a first additive which is distributed with even concentration over an inside of each crystal grain and an interface of the crystal grain; and
   a second additive which is distributed with higher concentration in the interface of the crystal grain than in the inside of the crystal grain,
   wherein said first additive is at least one of Sn and oxides thereof, and
   wherein said second additive is at least one selected from the group consisting of Pd, Pt, Ru, and Rh.

2. The polycrystalline aluminum thin film according to claim 1, further comprising an aluminum oxide layer covering the entire surface of said crystal grain and said interface thereof.

3. The polycrystalline aluminum thin film according to claim 1, wherein an average diameter of the crystal grain of said polycrystal of said alloy of aluminum is 47 nm or less.

4. An optical recording medium comprising said polycrystalline aluminum thin film according to claim 1.

5. A mirror comprising said polycrystalline aluminum thin film according to claim 1.

6. An electrode comprising said polycrystalline aluminum thin film according to claim 1.

7. A sputtering target comprising said polycrystalline aluminum thin film according to claim 1.

* * * * *